United States Patent
Zhong et al.

(10) Patent No.: US 7,033,894 B1
(45) Date of Patent: Apr. 25, 2006

(54) METHOD FOR MODULATING FLATBAND VOLTAGE OF DEVICES HAVING HIGH-K GATE DIELECTRICS BY POST-DEPOSITION ANNEALING

(75) Inventors: Huicai Zhong, Wappinger Falls, NY (US); Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 24 days.

(21) Appl. No.: 10/633,596

(22) Filed: Aug. 5, 2003

(51) Int. Cl.
*H01L 21/336* (2006.01)
(52) U.S. Cl. ...................... 438/291; 438/785
(58) Field of Classification Search ............... 438/291, 438/785
See application file for complete search history.

(56) References Cited

U.S. PATENT DOCUMENTS

| | | | |
|---|---|---|---|
| 3,793,090 A * | 2/1974 | Barile et al. ............... 438/591 |
| 6,455,330 B1 * | 9/2002 | Yao et al. ..................... 438/3 |
| 6,743,682 B1 * | 6/2004 | Woerlee et al. ............ 438/291 |
| 6,844,604 B1 * | 1/2005 | Lee et al. .................... 257/410 |

\* cited by examiner

*Primary Examiner*—David S. Blum

(57) ABSTRACT

A method for modulating the flatband voltage of semiconductor devices includes post-deposition annealing of a high-k dielectric film deposited by chemical vapor deposition, for example. The modulation of the flatband voltage, and thus, the threshold voltage of MOSFET devices, is achieved by post-deposition annealing of the high-k dielectric film and control of the annealing parameters. These include annealing gases, annealing temperatures and annealing times.

12 Claims, 3 Drawing Sheets

METHOD FOR MODULATING FLATBAND VOLTAGE OF DEVICES HAVING HIGH-K GATE DIELECTRICS BY POST-DEPOSITION ANNEALING

FIELD OF THE INVENTION

The present invention relates to the field of semiconductor processing, and more particularly, to the formation of semiconductor devices high-k gate dielectrics.

BACKGROUND OF THE INVENTION

Over the last few decades, the electronics industry has undergone a revolution by various efforts to decrease the size of device elements formed in integrated circuits (ICs), and such efforts have contributed to increasing the density of circuit elements and device performance. A large variety of semiconductor devices have been manufactured having various applications in numerous disciplines.

Currently, the most common and important semiconductor technology presently used is silicon-based, and the most preferred silicon-based semiconductor device is a MOS (metal oxide semiconductor) transistor. The principal elements of a typical MOS transistor generally comprise a semiconductor substrate on which a gate oxide is provided. A gate electrode is formed on the gate oxide and is typically a heavily doped conductor to which an input signal is typically applied via a gate terminal. Heavily doped active regions, e.g., source/drain regions, are formed in the semiconductor substrate and are connected to source/drain terminals. A channel region is formed in the semiconductor substrate beneath the gate electrode and separates the source/drain regions. The separation of the gate electrode from the semiconductor substrate by the dielectric layer, e.g., the oxide layer, prevents current from flowing between the gate electrode and the source/drain regions or channel regions.

As the dimensions of the MOS devices are further scaled down to submicron and nanometer dimensions, the thickness of the gate oxide is also scaled down accordingly. However, such excessively reduced thickness of the gate oxide causes charge carrier leakage by tunneling effect, thereby leading to faster degradation of the MOS transistor.

To solve this concern, high-k (dielectric constant) gate dielectrics, e.g., $ZrO_2$, $HfO_2$, $InO_2$, $LaO_2$, $TaO_2$, were introduced to replace the silicon oxide for submicron MOS devices. The significant amount of positive fixed charge found within high-k films such as $HfO_2$, $ZrO_2$ and their silicates contributes a large negative flatband voltage shift for CMOSFET devices. This limits the threshold voltage of CMOSFET devices to a given range, although some form of channel implantation may be used to provide a degree of threshold modulation.

It is desirable to modify the flatband voltage, and thus the threshold voltage, of CMOSFET devices employing high-k dielectric films to provide more desirable threshold voltages for such devices. This would allow optimization of the threshold voltages for PMOSFET devices and NMOSFET devices respectively. For example, it is more desirable for the PMOSFET devices to have a higher flatband voltage than NMOSFET devices. (Threshold voltage is directly related to the flatband voltage).

SUMMARY OF THE INVENTION

The present invention satisfies the need for a method of modulating the flatband voltage of a high-k dielectric material that has been deposited on a silicon substrate. This is achieved, in certain embodiments, by control of a post-annealing process using a single annealing gas or combination of annealing gases. The effect of the post-deposition annealing conditions on the electrical properties of the high-k dielectrics allows the flatband voltage and thus the threshold voltage of MOSFET devices to be modulated in a controlled manner.

The foregoing and other features, aspects and advantages of the present invention will become more apparent from the following detailed description of the present invention when taken in conjunction with the accompanying drawings.

DETAILED DESCRIPTION

The present invention addresses and solves problems related to the formation of high-k dielectric films and a significant amount of positive fixed charge within such films that contributes to a very large negative flatband voltage shift for CMOSFET devices. In particular, the present invention achieves this improvement in such high-k dielectric films by post-deposition annealing under certain conditions that allows for modulation of the flatband voltage, and thus the threshold voltage, of CMOSFET devices in the large range of 0 to 700 mV. By controlling the post-annealing conditions, such as number of anneals, annealing gases, annealing temperatures and annealing times, the flatband voltage and thus, the threshold voltage, of the CMOS devices is controllable.

In the following description, a high-k dielectric film is defined as a film made of a dielectric material that has a value of k (dielectric constant) greater than 8. A number of different high-k dielectric films have been investigated for use in semiconductor processing. In the following description and examples, the high-k dielectric film that is deposited is Hf-silicate. However, the high-k dielectric film may be any appropriate high-k film employed in semiconductor processing.

Figure 1:
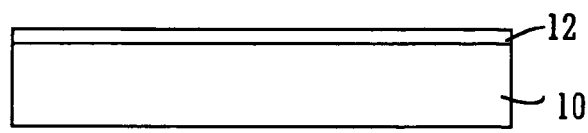
FIG. 1 is a cross-section of a portion of a semiconductor chip constructed in accordance with embodiments of the present invention during one phase of manufacture.

In FIG. 1, a wafer is depicted in cross-section and comprises a substrate 10, made of silicon, for example. A high-k dielectric film 12 is deposited, such as by chemical vapor deposition (CVD) over the surface of the substrate 10. The high-k dielectric film 12 is formed to any desired thickness by the use of CVD. A conventional CVD process for depositing high-k dielectric film may be employed to deposit the film 12.

Some of the concerns with high-k dielectric films include contamination of the deposited film by carbon, and interface traps that are present in the film. It is desirable to rid the film of interface traps and reduce or eliminate the carbon that has been deposited in the high-k dielectric film during the deposition of the film. Further, it is desirable to densify the film that has been deposited. Also, the deposited film 12 has a given dielectric constant that may not be optimum for the MOSFET devices to be formed using the high-k dielectric film 12. Accordingly, the post-deposition annealing process, in accordance with embodiments of the present invention, as described below, mitigates the above-described concerns and allows for modification of the flatband voltage and thus the threshold voltage of the semiconductor devices.

Figure 2:
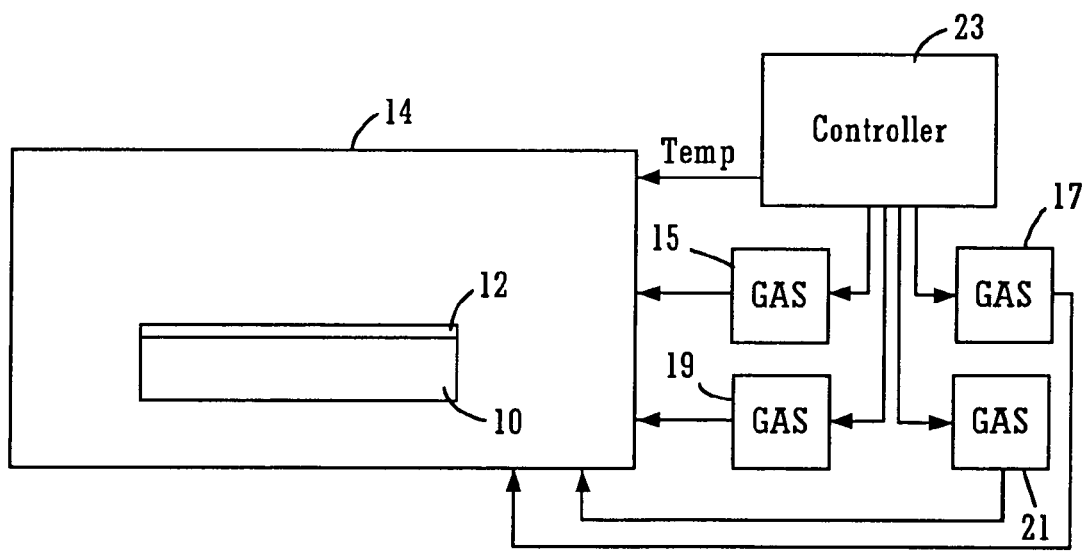
FIG. 2 is a depiction of the semiconductor chip during a post-deposition annealing process in accordance with methods of the present invention.

FIG. 2 schematically depicts a wafer that has been placed within an annealing chamber 14. Separate sources of annealing gases 15, 17, 19 and 21, for example, are supplied to the interior of the chamber 14. Temperature is shown as a control input to control the temperature within the chamber 14. Another annealing parameter that is controlled is the annealing time, although not depicted in FIG. 2. Controller 23 may be employed to provide either automatic or manual control of the annealing process. This control includes, as will be described in more detail below, control of the annealing gases, the annealing temperature, and annealing times for the post-deposition anneal of the high-k dielectric film 12.

In accordance with methods of the present invention, the flatband voltage of the semiconductor devices on the wafer are controlled by modifying the post-deposition annealing processing through controlling certain annealing parameters. In certain preferred embodiments of the invention, the annealing includes one or more of the following annealing gases: $O_2$, $N_2$, $H_2$, $NH_3$. One or more anneals, each anneal employing a different gas, will modulate the flatband voltage achieved. These gases are exemplary only, as other gases may be employed. For example, Ar may be employed instead of $N_2$. And $N_2O$ or NO can be employed.

An $NH_3$ anneal provides $H_2$ into the high-k dielectric film 12 to rid the film 12 of interface traps, which is charge that is not neutralized. Thus, the $NH_3$ annealing improves the quality of the high-k dielectric film. Similarly, an anneal with $O_2$ helps to rid the dielectric film 12 of carbon that was formed in the dielectric film during the deposition by CVD. The $H_2$ annealing is somewhat similar to the $NH_3$ annealing, and is typically used as a forming gas anneal to improve a film electrically. The $N_2$ annealing is performed at higher temperatures and produces a much higher flatband voltage, which is variable for P-channel devices.

Any number of combinations of annealing parameters may be employed to fine-tune the modulation of the flatband voltage of the devices formed on the wafer. The chart below describes the process employed in 25 separate wafers. Wafers 1–4 represent conventional dielectric material silicon dioxide ($SiO_2$) which is not subject to any annealing. Wafer 5 is a high-k dielectric material, Hf-silicate, which is not subject to any post-deposition annealing. Wafers 6–25 all represent high-k dielectric material, Hf-silicate, subjected to different annealing processes. Wafer 6, for example, describes three separate annealing steps. The first annealing step on the Hf-silicate is an $O_2$ annealing performed at 700° C. for 30 seconds. This is followed by an annealing in $N_2$ at 950° C. for 30 seconds. Finally, the dielectric film 12 is subjected to annealing in $H_2$ at 450° C. for 60 seconds. Wafers 7–25 are subjected to annealing conditions as detailed in the below chart.

| Wafer 1 | 12A $SiO_2$ - No further annealing |
|---|---|
| Wafer 2 | 12A $SiO_2$ - No further annealing |
| Wafer 3 | 17A $SiO_2$ - No further annealing |
| Wafer 4 | 17A $SiO_2$ - No further annealing |
| Wafer 5 | No annealing |
| Wafer 6 | O2 −700° C. −30s/N2 −950° C. −30s/H2 −450° C. −60s |
| Wafer 7 | NH3 −600° C. −30s/O2 −700° C. −10s/N2 −950° C. −30s/H2 −450° C. −60s |
| Wafer 8 | NH3 −650° C. −30s/O2 −700° C. −20s |
| Wafer 9 | O2 −700° C. −30s/NH3 −700° C. −30s |
| Wafer 10 | O2 −700° C. −10s/NH3 −700° C. −30s |
| Wafer 11 | NH3 −650° C. −30s/O2 −700° C. −20s/H2 −450° C. −60s |
| Wafer 12 | NH3 −600° C. −30s/O2 −700° C. −30s/N2 −950° C. −30s/H2 −450° C. −60s |
| Wafer 13 | NH3 −700° C. −30s/O2 −700° C. −10s/H2 −450° C. −60s |
| Wafer 14 | NH3 −650° C. −30s/O2 −700° C. −20s/N2 −950° C. −30s |
| Wafer 15 | O2 −700° C. −30s/NH3 −600° C. −30s/N2 −950° C. −30s |
| Wafer 16 | O2 −700° C. −10s/NH3 −600° C. −30s/N2 −950° C. −30s |
| Wafer 17 | NH3 −700° C. −30s/O2 −700° C. −30s/H2 −450° C. −60s |
| Wafer 18 | O2 −700° C. −10s/NH3 −600° C. −30s/H2 −450° C. −60s |
| Wafer 19 | NH3 −700° C. −30s/O2 −700° C. −30s/N2 −950° C. −30s |
| Wafer 20 | NH3 −700° C. −30s/O2 −700° C. −10s/N2 −950° C. −30s |
| Wafer 21 | O2 −700° C. −30s/NH3 −600° C. −30s/H2 −450° C. −60s |
| Wafer 22 | O2 −700° C. −10s/NH3 −700° C. −30s/N2 −950° C. −30s/H2 −450° C. −60s |
| Wafer 23 | NH3 −600° C. −30s/O2 −700° C. −30s |
| Wafer 24 | NH3 −600° C. −30s/O2 −700° C. −10s |
| Wafer 25 | O2 −700° C. −30s/NH3 −700° C. −30s/N2 −950° C. −30s/H2 −450° C. −60s |

Figure 4:
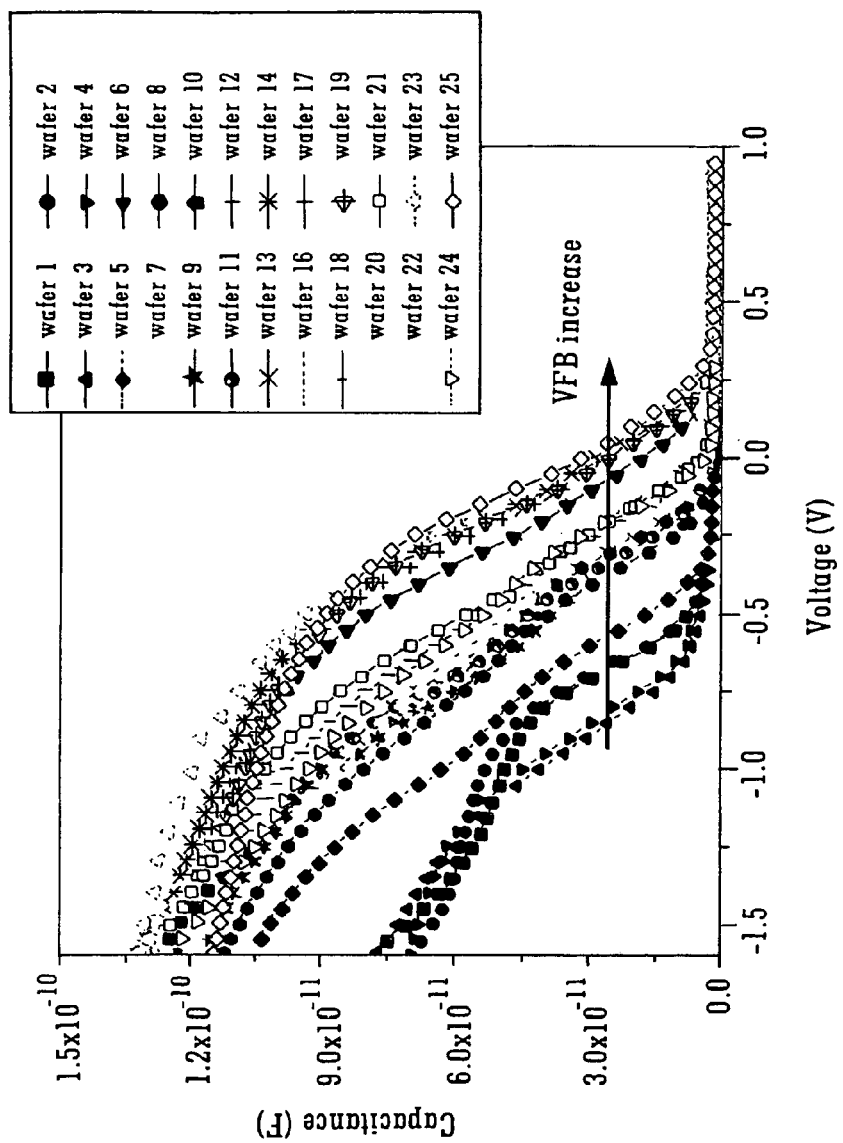
FIG. 4 depicts exemplary data plotted in a capacitance-voltage curve for wafers annealed under different annealing conditions.

FIG. 4 shows measurements of the capacitance (y-axis) versus voltage (x-axis) for each of the 25 wafers listed in the above chart. From the capacitance-voltage chart of FIG. 4, a flatband voltage diagram may be extracted to produce the diagram of FIG. 5. The flatband voltage is thus plotted for each of the 25 wafers in the above chart.

Figure 5:
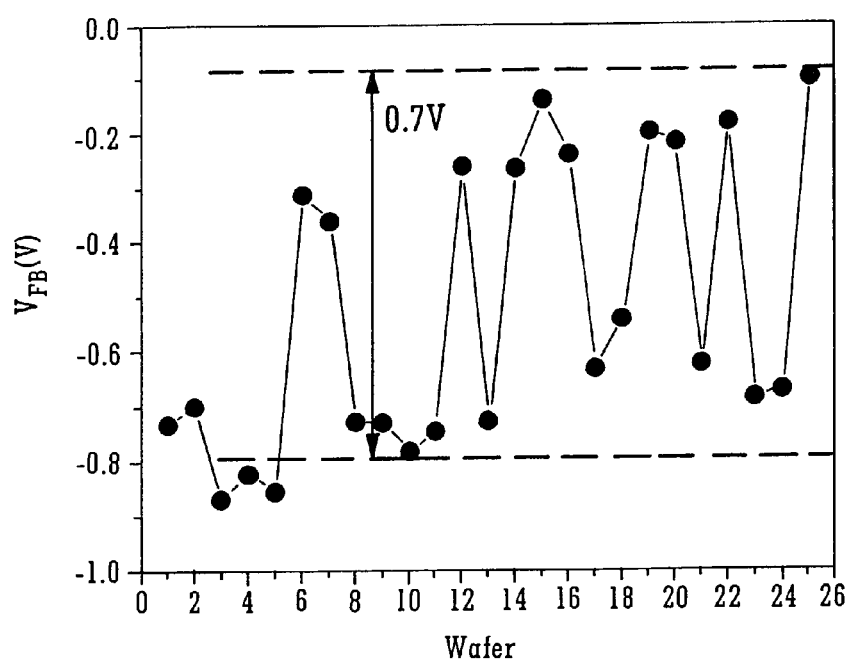
FIG. 5 is a flatband voltage diagram for the wafers annealed in accordance to different annealing conditions.

An examination of FIG. 5 reveals that modification of the annealing parameters, including annealing gases, temperature and time, allows the capability to provide a wide range of modulation of the flatband voltage. All of the voltages are increased in comparison to the high-k dielectric wafer 5 in which no deposition annealing is performed post-deposition of the film 12. Further, it should be recognized that a modulation range of 0.7 volts is achieved through control of the annealing parameters.

A number of the wafers have flatband voltage values greater than −0.4. These include wafers 6, 7, 12, 14–16, 19–20, 22 and 25. All of these wafers are characterized by annealing processes that include at least one annealing in $N_2$ gas. This annealing performed at high temperatures, such as 950° C., modulates the flatband voltage to a higher level than if the $N_2$ annealing was not performed. Hence, these wafers that have been subjected to an $N_2$ annealing are more suitable for use in P-channel applications, while those wafers whose flatband voltage has been modulated to a lower level are more suitable for N-channel devices.

Figure 3:
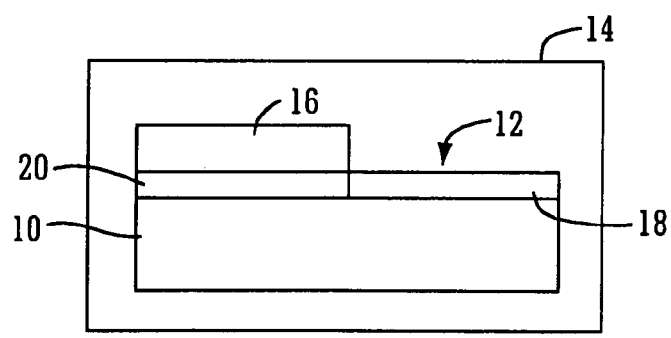
FIG. 3 shows the structure of FIG. 2 during an annealing process during which only a portion of the high-k dielectric film is exposed to the annealing gas, in accordance with methods of the present invention.

The ability to tailor the flatband voltage as depicted in FIG. 5 leads to a process by which only certain devices in a CMOS arrangement are exposed to the $N_2$ annealing step. This may be taken advantage of, as depicted in FIG. 3, by forming a mask 16 on the high-k dielectric film so as to expose the high-k dielectric film 12 in areas in which the P-channel devices will be formed. This area is designated by reference numeral 18. The high-k dielectric film 12 for N-channel devices 20 is masked off by the mask 16, while the film 12 for the P-channel devices 18 is exposed. (Only the chamber 14 is shown in FIG. 3, for illustration purposes.)

Hence, the entire high-k dielectric film 12 may be exposed to the $NH_3$, $O_2$, and $H_2$ anneals, but the mask 16 is provided to mask off the high dielectric film 12 for the N-channel devices 20, while exposing the film 12 for the P-channel devices 18 to annealing with $N_2$. This provides an optimization of the flatband voltage by modulation of the characteristics of a high-k dielectric film 12 in accordance with the parameters achieved and depicted in FIG. 5.

The present invention thus provides methodology for modulating the flatband voltage, and thus the threshold voltage, of MOSFET devices in a production-worthy method. The high-k dielectric films are improved by the post-deposition annealing in accordance with the methods of the present invention.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of modulating the flatband voltage of a high-k dielectric material of a semiconductor device, comprising the steps of:
   depositing the high-k dielectric material on a surface; and
   controllably modulating the flatband voltage of the high-k dielectric material by annealing the high-k dielectric material under controlled annealing parameters, wherein:
      the controlled annealing parameters include at least one of: annealing temperatures; annealing times; annealing gases; and number of anneals;
      the annealing includes controlling the temperature of anneals about 400° C. to about 1000° C.; and
      the annealing includes a plurality of anneals with a different annealing gas in each anneal.

2. The method of claim 1, wherein the annealing gases include at least one of: $O_2$, $N_2$, $H_2$ and $NH_3$.

3. The method of claim 2, wherein the annealing includes controlling the annealing time between 10 seconds to 60 seconds.

4. The method of claim 1, wherein the step of controlling modulating includes changing the flatband voltage by at least 0.3V.

5. The method of claim 1, wherein the step of controllably modulating includes modulating the high-k dielectric material for P-channel devices to a first value and the high-k dielectric material for N-channel devices to a second value different from the first value.

6. A method of modulating the flatband voltage of a high-k dielectric material of a semiconductor device, comprising the steps of:
   depositing the high-k dielectric material on a surface; and
   controllably modulating the flatband voltage of the high-k dielectric material by annealing the high-k dielectric material under controlled annealing parameters, wherein the step of controllably modulating includes modulating the high-k dielectric material for P-channel devices to a first value and the high-k dielectric material for N-channel devices to a second value different from the first value, and the step of modulating the high-k dielectric material for P-channel devices to a first value includes annealing with $N_2$.

7. The method of claim 6, further comprising preventing exposure of the high-k dielectric material for N-channel devices to the $N_2$ during the step of modulating the high-k dielectric material for P-channel devices.

8. A method for forming a semiconductor chip, comprising the steps of:
   depositing a high-k dielectric film;
   annealing to modify the flatband voltage of the high-k dielectric film to a first value for a first set of devices on the chip; and
   annealing to modify the flatband voltage of the high-k dielectric film to a second value, different than the first value, for a second set of devices on the chip, wherein:
      the first set of devices are N-channel devices and the second set of devices are P-channel devices; and
      the step of annealing to modify the flatband voltage of the high-k dielectric film includes masking the N-channel devices and subjecting the P-channel devices to annealing with $N_2$.

9. The method of claim 8, further comprising subjecting both the N-channel devices and the P-channel devices to an annealing with $NH_3$ and an annealing with $O_2$.

10. The method of claim 9, further comprising subjecting both the N-channel devices and the P-channel devices to an annealing with $H_2$.

11. The method of claim 10, further comprising controlling annealing temperature during each annealing to control the flatband voltage of the high-k dielectric film.

12. The method of claim 11, further comprising controlling annealing time during each annealing to control the flatband voltage of the high-k dielectric film.

* * * * *